(12) United States Patent
Tanabe

(10) Patent No.: US 7,038,640 B2
(45) Date of Patent: May 2, 2006

(54) SELF-EMISSION DISPLAY DEVICE AND METHOD FOR DRIVING THE SAME

(75) Inventor: Takahisa Tanabe, Tsurugashima (JP)

(73) Assignee: Pioneer Corporation, Tokyo-to (JP)

( * ) Notice: Subject to any disclaimer, the term of this patent is extended or adjusted under 35 U.S.C. 154(b) by 175 days.

(21) Appl. No.: 10/100,035

(22) Filed: Mar. 19, 2002

(65) Prior Publication Data

US 2002/0135547 A1 Sep. 26, 2002

(30) Foreign Application Priority Data

Mar. 21, 2001 (JP) ............................ P2001-080264

(51) Int. Cl.
*G09G 3/30* (2006.01)
(52) U.S. Cl. .......................................... 345/76; 345/80
(58) Field of Classification Search .................. 345/76, 345/80, 45, 36, 44, 82; 315/169.3; 348/223, 348/223.1; 257/113; 363/97
See application file for complete search history.

(56) References Cited

U.S. PATENT DOCUMENTS 3,786,307 A * 1/1974 Robinson ..................... 345/80
4,063,075 A * 12/1977 Collom ....................... 700/212
4,942,392 A * 7/1990 Loret et al. .................... 345/82
5,485,201 A * 1/1996 Aoki et al. ............... 348/223.1
5,814,841 A * 9/1998 Kusuda et al. .............. 257/113
6,046,547 A * 4/2000 Nishio et al. ............. 315/169.3
6,548,960 B1 * 4/2003 Inukai ....................... 315/169.3
6,580,409 B1 * 6/2003 Ito et al. ......................... 345/76
6,624,838 B1 * 9/2003 Sekiya et al. ................ 347/237
6,885,568 B1 * 4/2005 Kernahan et al. .............. 363/97
2004/0260470 A1* 12/2004 Rast ............................ 701/300

FOREIGN PATENT DOCUMENTS

EP          0 949 604 A1    10/1999
JP          2000-299192     10/2000

* cited by examiner

*Primary Examiner*—Vijay Shankar
*Assistant Examiner*—Prabodh Dharia
(74) *Attorney, Agent, or Firm*—Sughrue Mion, PLLC (57) ABSTRACT

A self emission display device for controlling a lit-up/non-lit-up state of a light emitting element by controlling a current flowing therethrough comprises: a plurality of light emitting elements arrayed in a matrix; and a plurality of SCRs for controlling a current flowing through the light emitting elements, corresponding to each of the light emitting elements; wherein each of the light emitting elements is connected to an anode in each of the SCRs.

17 Claims, 10 Drawing Sheets

FIG. 2B
P-GATE TYPE SCR

SELF-EMISSION DISPLAY DEVICE AND METHOD FOR DRIVING THE SAME

BACKGROUND OF THE INVENTION

1. Field of the Invention

The present invention relates to such display device and method for driving the same that uses a current-control type self-emission element such as an organic electro-luminescent (EL) element or a light emitting diode (LED).

2. Description of the Related Art

Conventionally, this type of a practical display device has typically employed a passive matrix driving method. By the passive matrix driving method, however, an instantaneous current and a driving voltage both rise remarkably in a high duty-ratio driving period, thus inevitably restricting the number of scan electrodes that can be driven at a time. It is, therefore, difficult to employ the passive matrix driving method to realize a relatively high-definition display device that requires a few hundreds of scan electrodes.

In this view, recently, there has been much research and development conducted for practical application of an active matrix driving method that can substitute for the passive matrix driving method. By the active matrix driving method, a switching element (driving element) is disposed at each picture element at each of the intersection between scan electrodes and signal electrodes in a matrix, for lower power dissipation and higher definition.

As the driving element used in the active matrix driving method, a thin film transistor (TFT) has been tried to be used in a variety of manners and researches; to drive a current control type self emission element, however, the TFT must be used two for each picture element, to resultantly decrease the numeric aperture, which is accompanied by also a complicated manufacturing process, thus leading to a problem of a decrease in yield.

To solve the problem, such a proposal is made to use a thyrister as the driving element by an invention disclosed in Japanese Patent Application Laid-Open No. 2000-299192.

By this invention, however, the thyrister itself is controlled in driving by controlling a voltage applied across, so that, as described in such a specification, an organic EL element will be lit up, even if a little (4.5 cd/m$^2$), as against illumination thereof (100 cd/m$^2$) even in a period for which it must not be lit up.

SUMMARY OF THE INVENTION

It is therefore an object of the present invention to provide a self emission display device and method for driving the same that can realize active driving of a high-performance self emission-display device excellent in numeric aperture, contrast, etc. with a relatively simple construction.

The above object of the present invention can be achieved by a self emission display device for controlling a lit-up/non-lit-up state of a light emitting element by controlling a current flowing therethrough provided with: a plurality of light emitting elements arrayed in a matrix; and a plurality of SCRs for controlling a current flowing through the light emitting elements, corresponding to each of the light emitting elements; wherein each of the light emitting elements is connected to an anode in each of the SCRs.

According to the present invention, a silicon controlled rectifier (SCR) is used in configuration as the driving element to provide an optimal driving method, so that it is possible to realize active driving of a high-performance self emission display excellent in numeric aperture, contrast, etc. with a relatively simple configuration. Moreover, as compared to a case of using a TFT as the driving element, the SCR can be formed by an extremely simple manufacturing process, that is, it can formed as stacked on a stack type light emitting element by almost the same manufacturing process including evaporation as that for the light emitting element, thus also reducing the costs for manufacture.

In one aspect of the self emission display device of the present invention, the light emitting elements are organic EL elements.

In another aspect of the self emission display device of the present invention, the light emitting elements are light emitting diodes.

In further aspect of the self emission display device of the present invention, a ratio in static capacity between the SCR and the light emitting element is adjusted to thereby optimize a ratio of a voltage applied to the SCR and a voltage applied to the light emitting element in a non-conducting state.

According to this aspect, by optimizing a ratio between a voltage applied across an SCR and that applied across a light emitting element, they can be matched with each other.

In further aspect of the self emission display device of the present invention, the self emission display device has a control device to set a current value that corresponds to a target brightness based on a current vs. brightness characteristic of the light emitting element to thereby set an optimal source voltage that corresponds to the set current value based on voltage vs. current characteristics of both the SCR and the light emitting element.

According to this aspect, a target brightness can be obtained easily.

In further aspect of the self emission display device of the present invention, the lit-up/non-lit-up states of each of the light emitting elements are determined by a voltage value applied to a gate in each of the SCRs.

According to this aspect, by switching a voltage applied at the gate of an SCR, it is possible to securely light up a light emitting element in a period during which it must be in the lit-up state and not to light it up securely in a period during which it must be in the non-lit-up state, thus realizing a sufficiently good contrast.

In further aspect of the self emission display device of the present invention, a break-over voltage in each of the SCRs is determined by a voltage value applied to a gate in each of the SCRs, the light emitting element is lighted up by decreasing the break-over voltage.

According to this aspect, by switching a voltage applied at the gate of an SCR, it is possible to securely light up a light emitting element in a period during which it must be in the lit-up state and not to light it up securely in a period during which it must be in the non-lit-up state, thus realizing a sufficiently good contrast.

The above object of the present invention can be achieved by a self emission display device for controlling a lit-up/non-lit-up state of a light emitting element by controlling a current flowing therethrough provided with: a plurality of light emitting elements arrayed in a matrix; and a plurality of SCRs for controlling a current flowing through the light emitting elements, corresponding to each of the light emitting elements; wherein each of the light emitting elements is connected to a cathode in each of the SCRs.

According to the present invention, a silicon controlled rectifier (SCR) is used in configuration as the driving element to provide an optimal driving method, so that it is possible to realize active driving of a high-performance self emission display excellent in numeric aperture, contrast, etc.

with a relatively simple configuration. Moreover, as compared to a case of using a TFT as the driving element, the SCR can be formed by an extremely simple manufacturing process, that is, it can formed as stacked on a stack type light emitting element by almost the same manufacturing process including evaporation as that for the light emitting element, thus also reducing the costs for manufacture.

The above object of the present invention can be achieved by a self emission display device for controlling a lit-up/non-lit-up state of a light emitting element by controlling a current flowing therethrough provided with a plurality of light emitting elements arrayed in a matrix; wherein the light emitting elements are light emitting SCRs.

According to the present invention, it is possible to manufacture a self emission display device with an even simpler construction.

The above object of the present invention can be achieved by a method for driving a self emission display device having a plurality of light emitting elements arrayed in a matrix and a plurality of SCRs for controlling a current flowing through the light emitting elements, wherein each of the light emitting elements is connected to an anode in each of the SCRs, provided with: a process of scanning sequentially each of the SCRs; and a process of driving each of the SCRs so that each of the light emitting elements be sustained in a conducting or non-conducting state.

According to the present invention, a silicon controlled rectifier (SCR) is used as the driving element to provide an optimal driving method, so that it is possible to realize active driving of a high-performance self emission display excellent in numeric aperture, contrast, etc. with a relatively simple configuration.

In one aspect of the method for driving a self emission display device of the present invention, the light emitting elements are organic EL elements.

In another aspect of the method for driving a self emission display device of the present invention, the light emitting elements are light emitting diodes.

In further aspect of the method for driving a self emission display device of the present invention, a ratio in static capacity between the SCR and the light emitting element is adjusted to thereby optimize a ratio of a voltage applied to the SCR and a voltage applied to the light emitting element in a non-conducting state.

According to this aspect, by optimizing a ratio between a voltage applied across an SCR and that applied across a light emitting element, they can be matched with each other.

In further aspect of the method for driving a self emission display device of the present invention, the method comprises: a process of setting a current value that corresponds to a target brightness based on a current vs. brightness characteristic of the light emitting element; and a process of setting an optimal source voltage that corresponds to the set current value based on voltage vs. current characteristics of both the SCR and the light emitting element.

According to this aspect, a target brightness can be obtained easily.

In further aspect of the method for driving a self emission display device of the present invention, each of the SCRs are of a P-gate type, each of the gates of which are connected to a common gate switch that can switch over a high potential and a low potential for each column in a matrix, each of the anodes of which are connected via their respective ones of the light emitting elements to a common power source, and each of the cathodes of which are connected for each row thereof in the matrix to a common scan switch that can switch over a high potential, a low potential, and an intermediate potential; when each of the light emitting elements is in a non-selected period, the corresponding one of the gate switches is set to the high potential and the corresponding one of the scan switches is set to the intermediate potential; and when each of the light emitting elements is in a selected period, the corresponding one of the scan switches is set to the high potential and then to the low potential and, to light up any one of the light emitting element, the corresponding one of the gate switches is set to the high potential in a period when the scan switch is at the low potential and also, not to light up the light emitting element, the corresponding one of the gate switches is set to the lower potential in a period when the scan switch is at the low potential, to thereby sustain a conducting/non-conducting state of each of the light emitting elements in driving.

In further aspect of the method for driving a self emission display device of the present invention, each of the SCRs are of an N-gate type, each of the gates of which are connected to a common gate switch that can switch over a high potential and a low potential for each column in a matrix, each of the cathodes of which are connected via their respective ones of the light emitting elements to a common power source, and each of the anodes of which are connected for each row thereof in the matrix to a common scan switch that can switch over a high potential, a low potential, and an intermediate potential; when each of the light emitting elements is in a non-selected period, the corresponding one of the gate switches is set to the high potential and the corresponding one of the scan switches is set to the intermediate potential; and when each of the light emitting elements is in a selected period, the corresponding one of the scan switches is set to the high potential and then to the low potential and, to light up any one of the light emitting element, the corresponding one of the gate switches is set to the low potential in a period when the scan switch is at the high potential and also, not to light up the light emitting element, the corresponding one of the gate switches is set to the high potential in a period when the scan switch is at the high potential, to thereby sustain a conducting/non-conducting state of each of the light emitting elements in driving.

The above object of the present invention can be achieved by a method for driving a self emission display device having a plurality of light emitting elements arrayed in a matrix and a plurality of SCRs for controlling a current flowing through the light emitting elements, wherein each of the light emitting elements is connected to a cathode in each of the SCRs, provided with: a process of scanning sequentially each of the SCRs; and a process of driving each of the SCRs so that each of the light emitting elements be sustained in a conducting or non-conducting state.

According to the present invention, a silicon controlled rectifier (SCR) is used as the driving element to provide an optimal driving method, so that it is possible to realize active driving of a high-performance self emission display excellent in numeric aperture, contrast, etc. with a relatively simple configuration.

The above object of the present invention can be achieved by a method for driving a self emission display device having a plurality of light emitting elements arrayed in a matrix and a plurality of SCRs for controlling a current flowing through the light emitting elements, provided with: a process of scanning sequentially each of the SCRs to provide each of the light emitting elements with a selected period in which a lit-up/non-lit-up state of the light emitting elements is determined; and a process of applying a predetermined voltage to a gate of the corresponding one of the SCRs in the selected period to light up any of the light emitting elements.

According to the present invention, by switching a voltage applied at the gate of an SCR, it is possible to securely light up a light emitting diode in a period during which it must be in the lit-up state and not to light it up securely in a period during which it must be in the non-lit-up state, thus realizing a sufficiently good contrast.

The above object of the present invention can be achieved by A method for driving a self emission display device having a plurality of light emitting elements arrayed in a matrix, wherein the light emitting elements are light emitting SCRs, provide with: a process of scanning sequentially each of the light emitting SCRs; and a process of driving each of the light emitting SCRs so that each of the light emitting SCRs be sustained in a conducting or non-conducting state.

DETAILED DESCRIPTION OF THE PREFERRED EMBODIMENTS

The following will describe preferred embodiments of the present invention with reference to the drawings. The following description actually relates to an embodiment in which a self emission display device of the present invention is applied as an organic EL display device.

Figure 1:
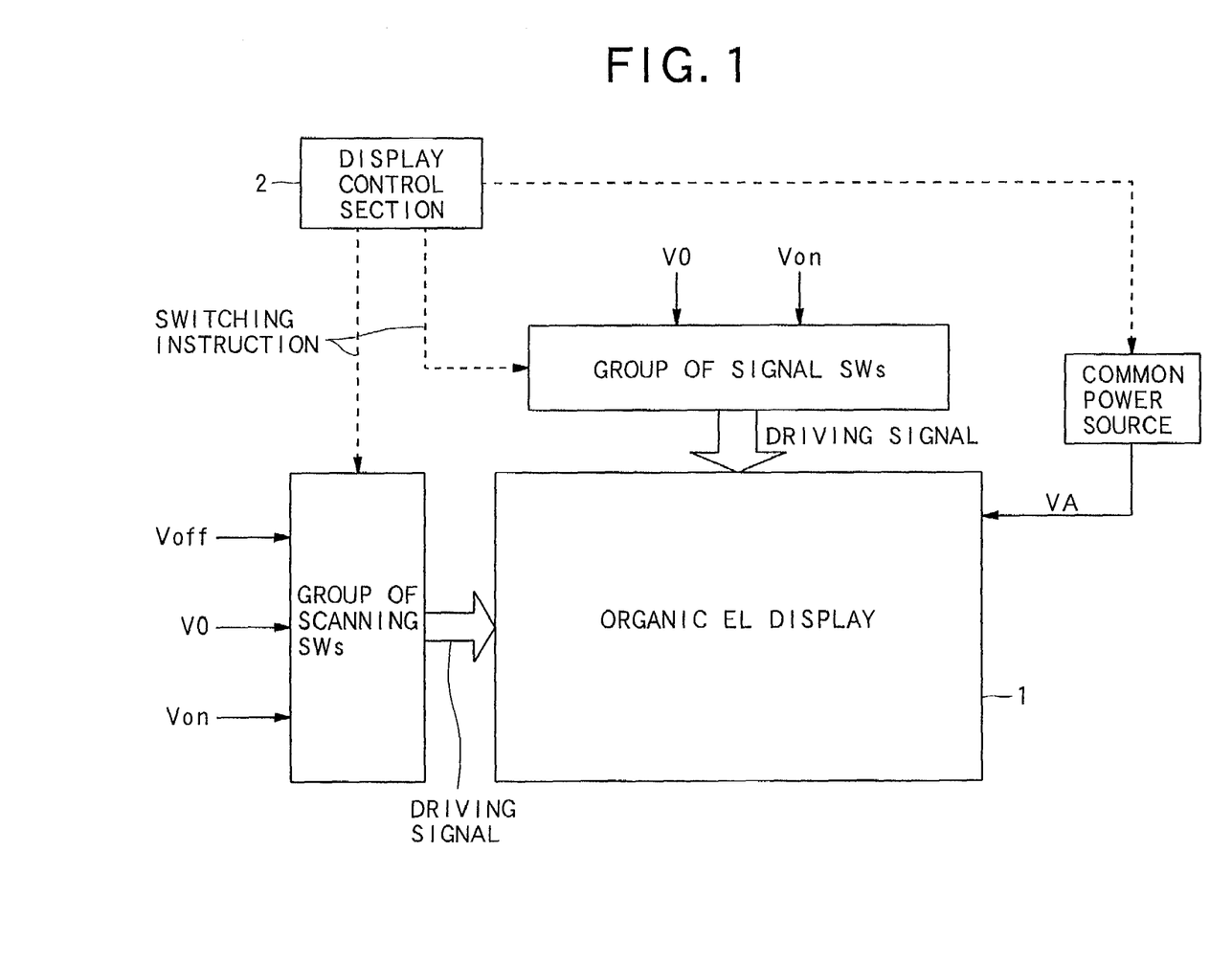
FIG. 1 is a block diagram for showing a schematic configuration of an organic EL display device according to an embodiment.

First, a configuration and a function of the organic EL display device of this embodiment are described with reference to FIGS. 1–4. FIG. 1 shows a schematic configuration of the organic EL display device according to this embodiment. As shown in FIG. 1, the organic EL display device 100 comprises: an organic EL, display 1 including a plurality of organic EL elements arrayed in a matrix and a plurality of SCRs for controlling a current flowing through these organic EL elements; and a display control section 2 as a control device for using the SCRs in active matrix driving. This embodiment combines the organic EL elements acting as a light emitting element and the SCRs acting as a driving element to thereby realize optimal active matrix driving.

Figure 2A:
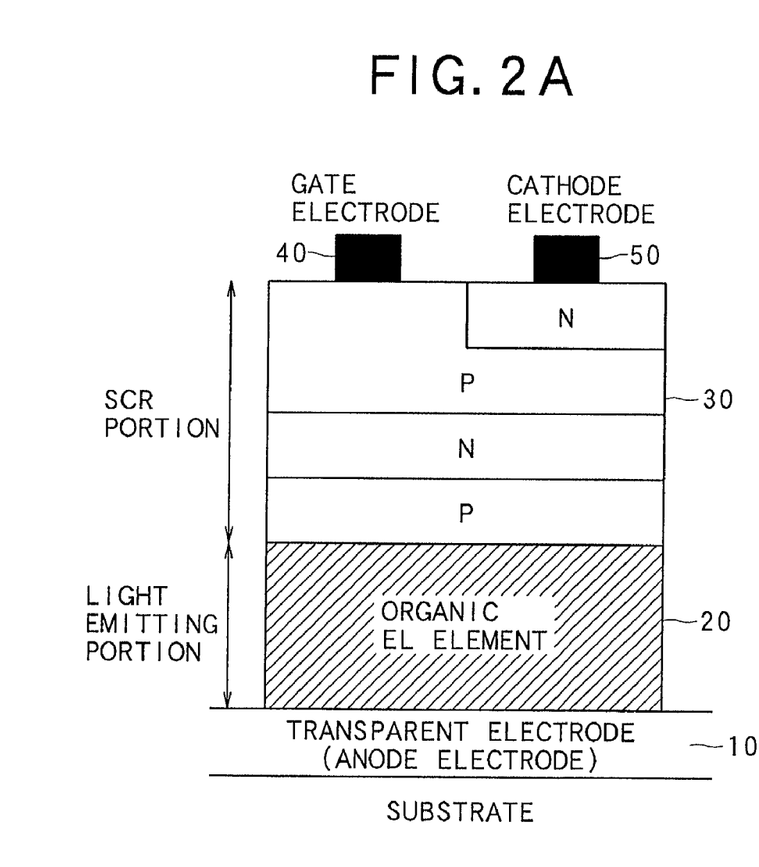
FIGS. 2A to 2C are illustrations for showing an example of an element configuration of an organic EL element and an SCR.
Figure 2B:
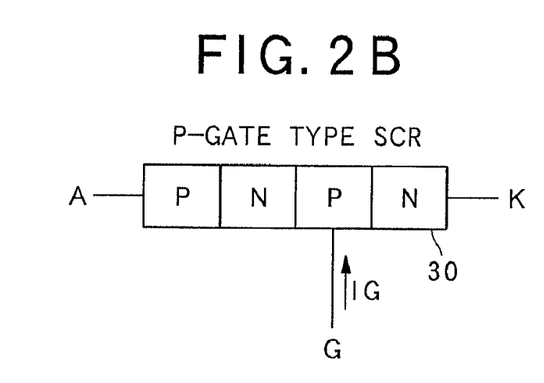
Figure 2C:
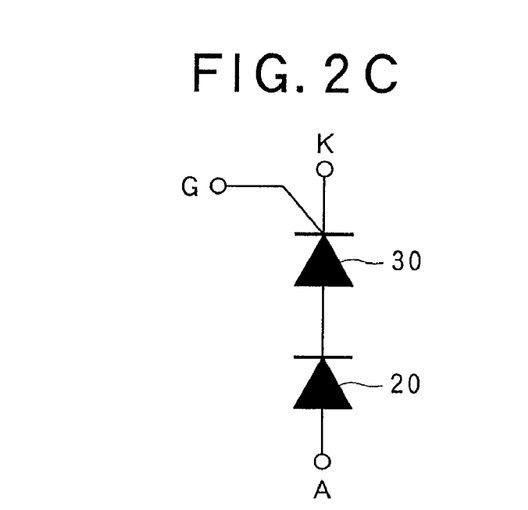
Figure 3:
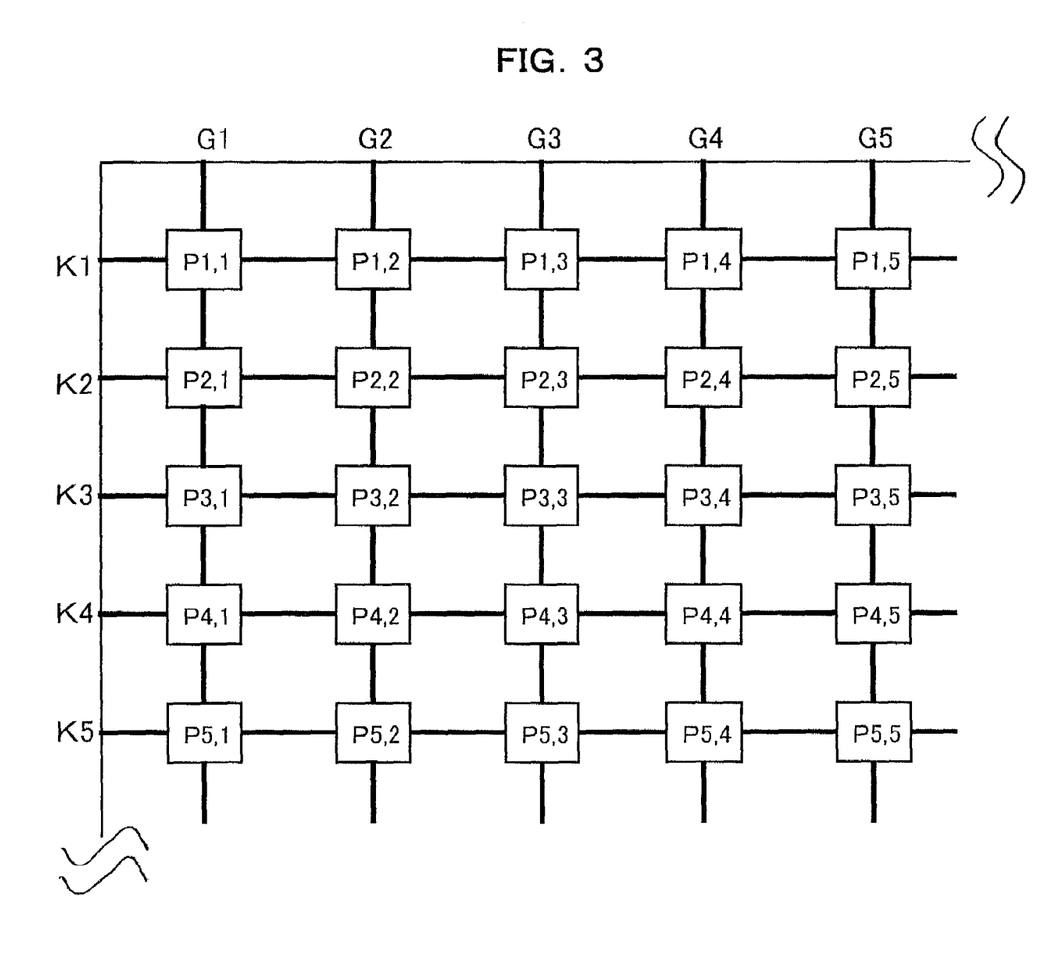
FIG. 3 is an illustration for showing a configuration of an organic EL display device in which the organic EL elements are arrayed in a matrix (P1, 1, P1, 2, . . . )

FIG. 2A shows an example of an element configuration of an organic EL element and an SCR element. As shown in it, an organic EL element 20 is stacked on an anode electrode 10 realized as such a transparent electrode formed on a transparent substrate that is made of a transparent electrode material such as ITO. On this organic EL element 20 is stacked an SCR 30, to be connected with an anode A in the SCR 30. Note here that in the example of FIG. 2A, the SCR 30 is of a P-gate type such as shown in FIG. 2B. At a gate G of the SCR 30 is formed a gate electrode 40, while at a cathode K of the SCR 30 is formed a cathode electrode 50. Note here that FIG. 2C is an equivalent circuit of the element construction of FIG. 2A. Thus stacked organic EL element 20 and SCR 30 are arrayed in a matrix (P1, 1, P1, 2, . . . ) as shown in FIG. 3, thus forming the organic EL display 1.

Thus, it is possible to stack the SCR 30 on the stacked organic EL element 20 by almost the same manufacturing method including evaporation as that for the organic EL element 20, thereby manufacturing the device with a simple manufacturing process.

Figure 4:
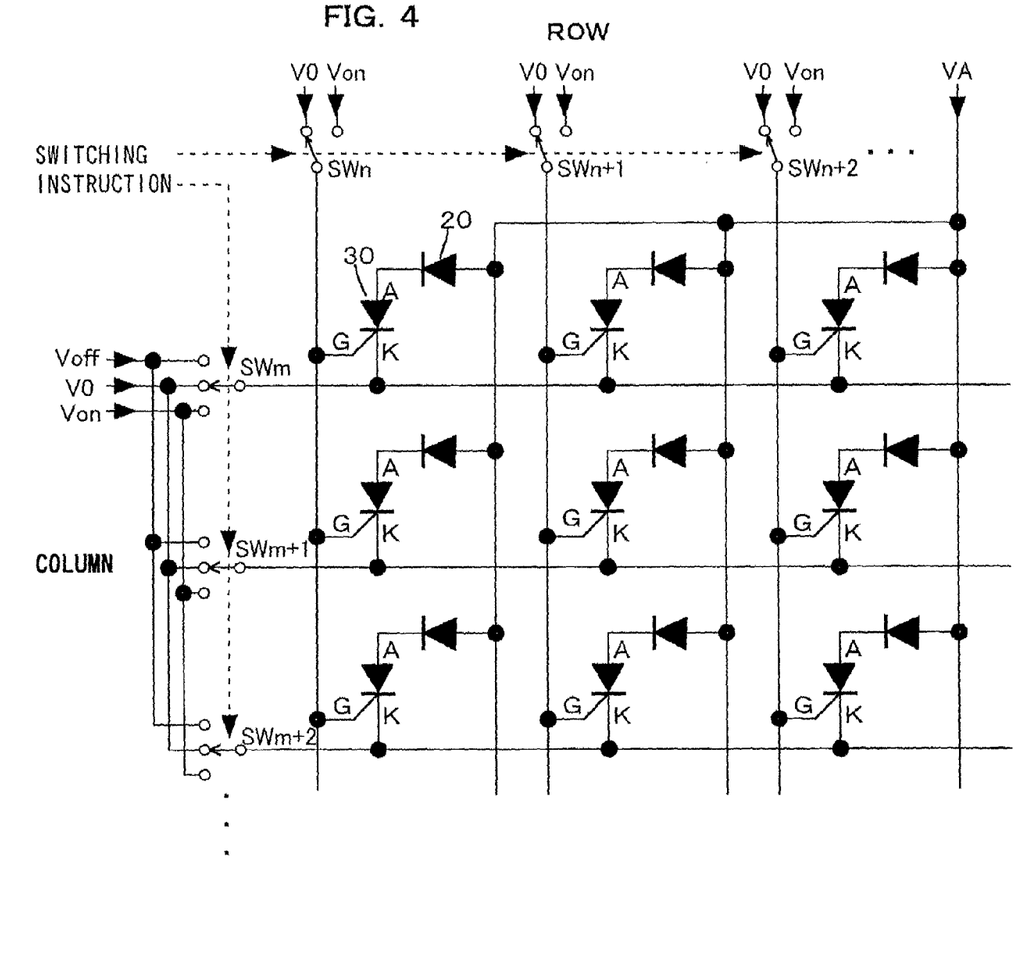
FIG. 4 is an illustration for showing an example of a circuit connection configuration having an organic EL display comprised of organic EL elements and SCRs arrayed in a matrix, a group of scan switches (SWs), a group of gate (signal) switches (SWs), etc.

FIG. 4 is an illustration for showing an example of a circuit connection configuration having an organic EL display 1 comprised of organic EL elements 20 and SCRs 30 arrayed in a matrix, a group of scan switches (SWs), a group of gate (signal) switches (SWs), etc. In FIG. 4, the anode electrodes 10 of the organic EL elements 20 are connected to a common power source, the gate electrodes 40 of the SCRs 30 in each column are connected to the corresponding one of common signals SWn, SWn+1, SWn+2, and the cathode electrode 50 of the SCRs 30 in each row are connected to the corresponding one of common scan signals SWm, SWm+1, SWm+2, . . . . The signals SWn, SWn+1, SWn+2, . . . each respond to a switching instruction sent from the display control section 2 to thereby switch over two potentials (here, ON (high) potential of V0 (0V) and OFF (low) potential of Von (<0 V)) supplied from a power source, thus giving a driving signal to the organic EL display 1. The scan signals SWm, SWm+1, SWm+2, . . . each respond to the switching instruction sent from the display control section 2 to thereby switch over three potentials (here, high potential of Voff (>0 V), an intermediate potential of V0 (0V), and a low potential of Von (<0V)), thus giving the driving signal to the organic EL display 1.

The display control section 2 includes a CPU and a composite logic circuit having an operation function and also a memory etc., thus having a function to transfer display data etc. with an external device and then analyze and convert it into matrix data to be displayed at a predetermined position on the organic EL display 1. If each organic EL element 20 at an intersection in the matrix is supposed to be dot data for each picture element, the display control section 2 outputs a switching instruction to give the dot coordinates to each signal SW and each scanning SW. Furthermore, the display control section 2 controls the value of a common voltage VA of the common power source.

Next, the operations of the organic EL display device 100 are described with reference to FIG. 5.

Figure 5:
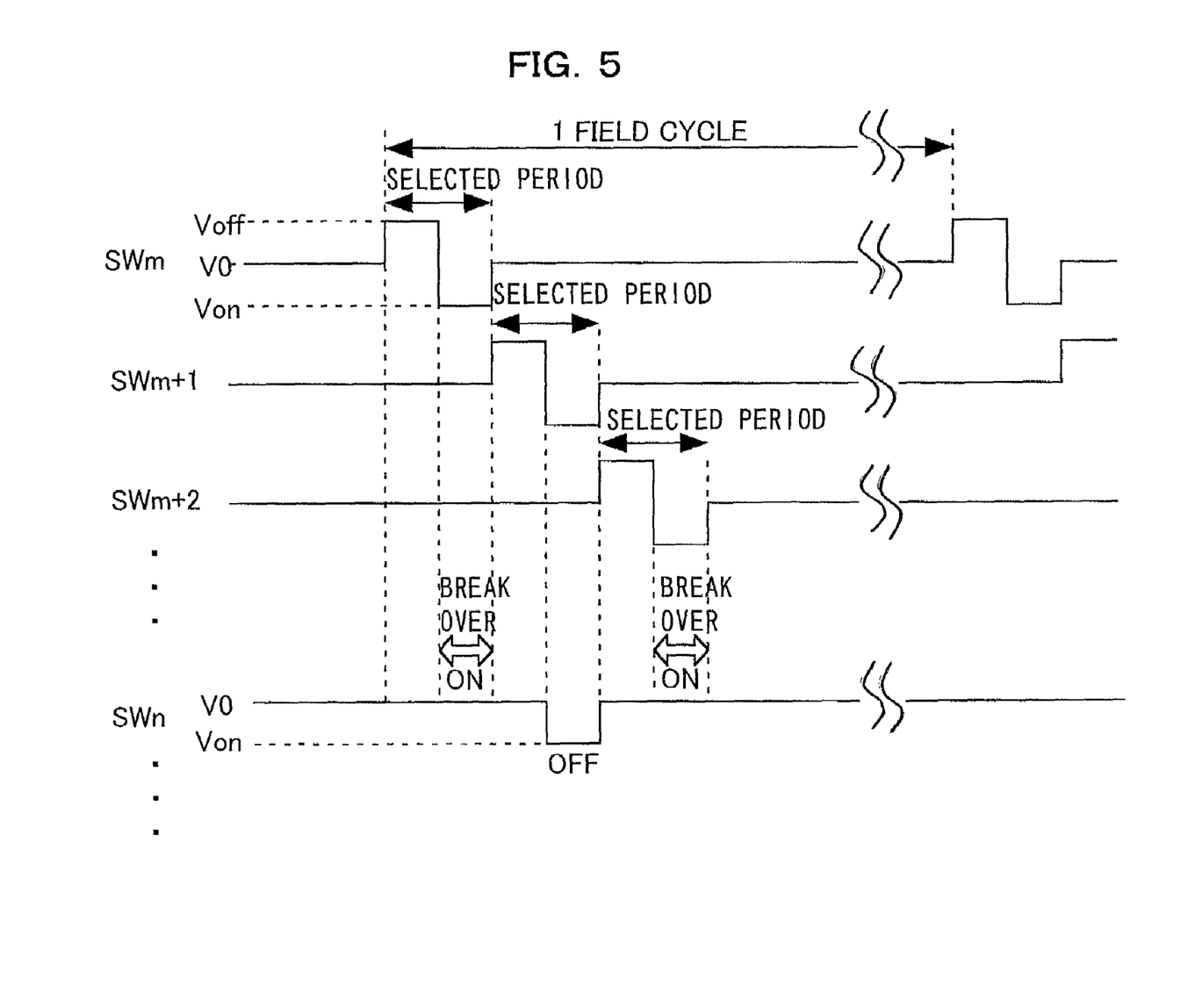
FIG. 5 is a timing chart for showing a driving signal for driving picture elements in an n'th column when m'th through (m+2)'th rows are being scanned in the circuit configuration of FIG. 4.

FIG. 5 is a timing chart for showing the driving signal for driving picture elements in an n'th column when m'th through (m+2)'th rows are being scanned in the circuit configuration of FIG. 4. Basically, it sequentially scans the rows to thereby determine lighting (illumination) or non-lighting (non-illumination) of each of the organic EL elements 20 in a selected row selecting a potential applied on the gate G of the SCR 30. In FIG. 5, the scan signals SWm through SWm+2 are held at the intermediate potential (V0) during a non-selected period. When they enter a selected period, the scan signals SWm through SWm+2 first switch over to the high potential (Voff) to reset the lit-up state of each of the organic EL elements and then switches over to the low potential (Von) for lit-up state/non-lit-up state selection.

To light up an organic EL element 20 in this low-potential period (while the scanning SW is held at the low potential (Von)), a signal SWn corresponding to this organic EL element 20 must be held at the ON potential (V0). That is, when the gate G is set to the ON potential (V0) with the cathode K of the corresponding SCR 30 held at the low potential (Von), a potential difference (V0–Von of, for example, 0.6V or higher) between the gate G and the cathode K causes a gate current IG to flow through the SCR 30, which causes the SCR 30 to break over and be turned ON, thus flowing a current between the anode A and the cathode K. This in turn causes a current to flow (conduct) also through the organic EL element 20 connected to that corresponding SCR 30, thus lighting up the organic EL element 20.

Not to light up an organic EL element 20 in this low potential period, on the other hand, a signal SWn corresponding to this organic EL element 20 must be set to the OFF potential (Von). That is, when the gate G is set to the OFF potential (Von) with the cathode K of the corresponding SCR30 held at the low potential (Von), no gate electrode flows because there is no potential difference between the gate G and the cathode K, so that the SCR 30 does not break over and stays in the OFF state, to thereby flow no current through the organic EL element 20 (non-conducting), thus avoiding lighting it up.

In the example of FIG. 5, during the low potential period of the scan signals SWm and Swm+2 when the m'th through (m+2)'the rows of the organic EL elements 20 of those in the n'th column are selected, the corresponding signal SWn is held at the ON potential (V0), to thereby put these organic EL elements 20 in the lit-up state. In the low potential period of the scanning SWm+1 when the organic EL elements 20 in the (m+1)'th row are selected, on the other hand, the corresponding signal SWn is switched over to the OFF potential (Von), to thereby put these organic EL elements in the non-lit-up state.

Thus set lit-up state and the non-lit-up state are held until the next scanning.

Figure 6:
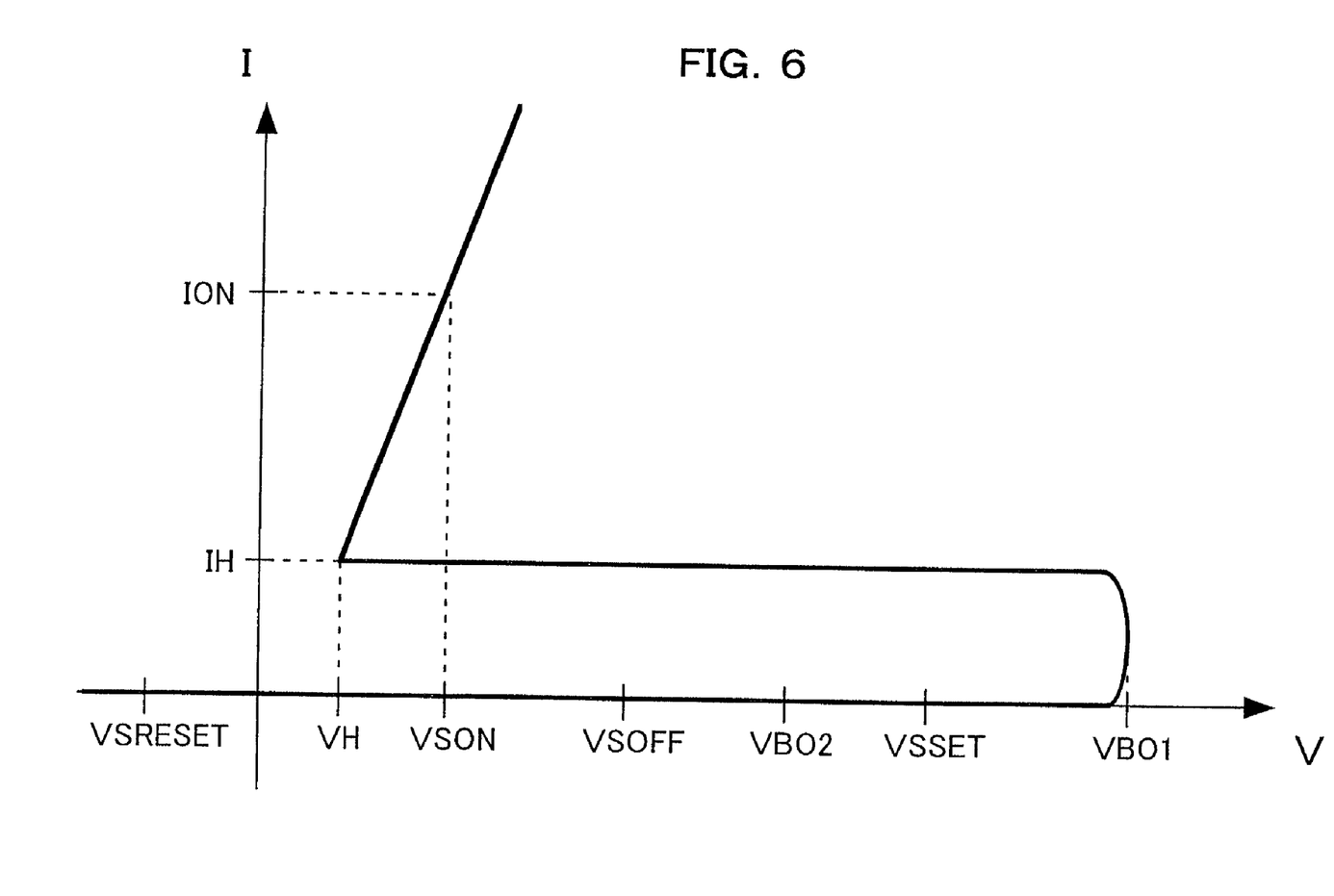
FIG. 6 is a graph for showing a relationship between a voltage applied between an anode A and a cathode K of an SCR30 and the corresponding current.

FIG. 6 shows a relationship between a voltage applied between an anode A and a cathode K of the SCR 30 and the corresponding current. In FIG. 6, VB01 indicates a break-over voltage when the gate current IG of the SCR30 does not flow, while VB02 indicates a break-over voltage when the gate current IG of the SCR 30 flows. Moreover, VSSET indicates a voltage applied between the anode A and the cathode K of the SCR 30 when the scanning SW is held at the low potential. As can be seen from FIG. 6, if the signal SW is set to the ON potential to flow the gate current IG in the low potential period of the scanning SW, the condition (voltage) of the SCR 30 breaking over can be decreased from VB01 to VB02, which is lower than VSSET, so that a current flows between the anode A and the cathode K of the SCR 30 to thereby light up the organic EL element 20.

That is, a control is conducted so that the SCR 30 may be caused to break over only in a period when the scanning SW is set to the low potential (Von) and the signal SW is set to the ON potential (V0), and the control is conducted so that the SCR 30 may be caused not to break over except for the period to flow no current at all through the organic EL elements 20. It is, therefore, possible not to light up the organic EL element 20 securely in a period during which it must be in the non-lit-up state, thus realizing a sufficiently good contrast.

Here, VSSET is given by the following equation (1), assuming a voltage applied to the organic EL element 20 during the low potential period of the scanning SW to be VELSET:

$$VSSET = (VA - Von) - VELSET \quad (1)$$

Furthermore, assuming static capacities of the organic EL element 20 and the SCR 30 to be CEL and CS respectively, a relationship between the voltage and the static capacity in a break-over free state in the low potential period of the scanning SW is given by the following equation (2):

$$VSSET \times CS = VELSET \times CEL \quad (2)$$

That is, since VSSET is determined by a ratio (CEL/CS) of static capacity between the organic EL element 20 and the SCR 30, it can be set at an appropriate value by adjusting this static capacity ratio, specifically by controlling the areas of the organic EL element 20 and the SCR 30, for example.

Furthermore, in FIG. 6, VSOFF indicates a voltage applied between the anode A and the cathode K of the SCR 30 when the organic EL element20 is in the non-lit-up state in the non-selected period and VSON indicates a voltage applied between the anode A and the cathode K of the SCR 30 when the organic EL element 20 is in the lit-up state. When the organic EL element 20 is in the lit-up state (when the SCR 30 is in the ON state), a current ION flows between the anode A and the cathode K of the SCR 30. Moreover, to sustain this SCR 30 in the ON state, it is necessary to apply a voltage not lest than VH between the anode A and the cathode K of the SCR 30. A sustaining current is IH when the voltage of VH is applied between the anode A and the cathode K of the SCR 30. VSR indicates a voltage applied between the anode A and the cathode K of the SCR 30 in the high potential period of the scanning SW (that is, period during which the scanning SW is held at the high voltage (Voff)) so that the SCR 30 may be turned OFF (reset).

VSOFF is given by the following equation (3), assuming a voltage applied on the organic EL element 20 when it is in the non-lit-up state to be VELOFF:

$$VSOFF = VA - VELOFF \quad (3)$$

Furthermore, a relationship between the voltage and the static capacity of the organic EL element 20 in the non-lit-up state is given by the following equation (4):

$$VSOFF \times CS = VELOFF \times CEL \quad (4)$$

Next, a method of setting, by the display control section 2, the target brightness LON of the organic EL element 20 is described with reference to FIG. 7.

Figure 7A:
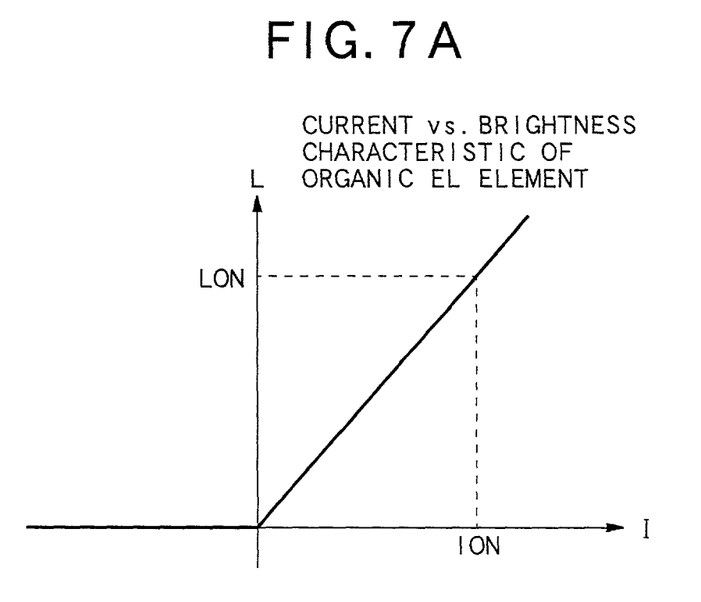
FIG. 7A is a graph for showing a current vs. brightness characteristic of an organic EL element 20.
Figure 7B:
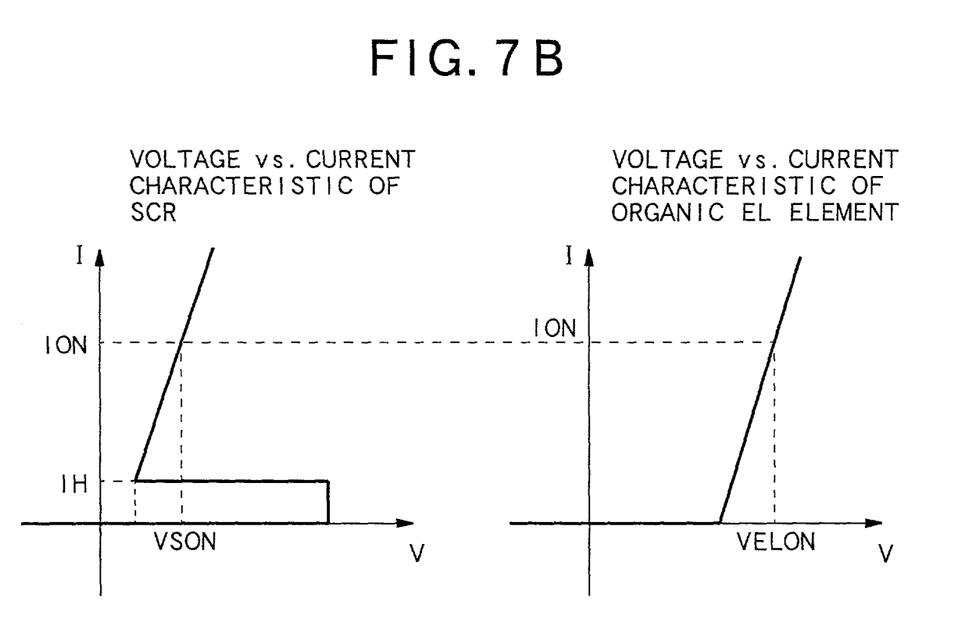
FIG. 7B is a graph for showing a voltage vs. current characteristic of the organic EL element 20 and that of the SCR30.
Figure 8:
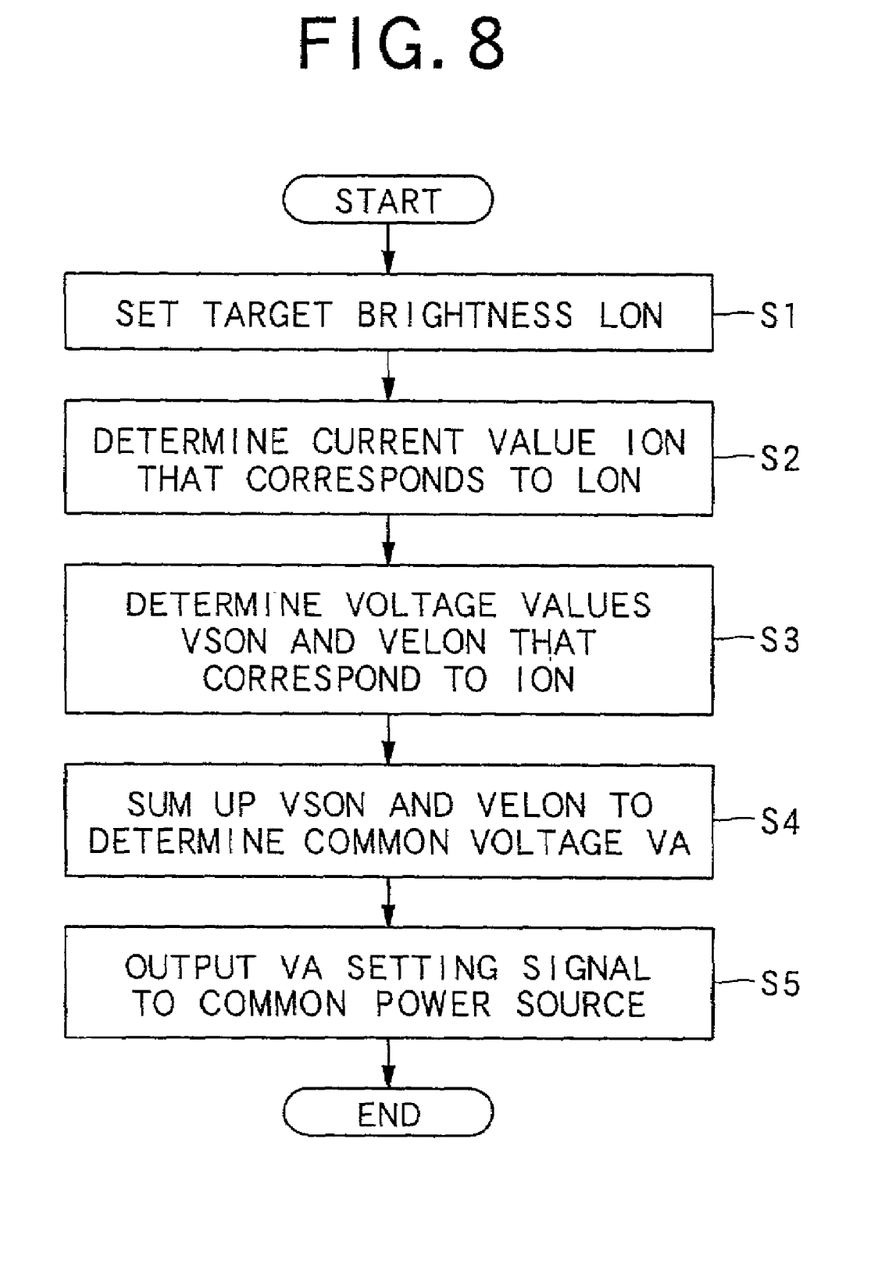
FIG. 8 is a flowchart for showing processing by a display device control section for setting a target brightness LON.

FIG. 7A shows a current vs. brightness characteristic of the organic EL element 20. FIG. 7B shows a voltage vs. current characteristic of the organic EL element 20 and that of the SCR 30. FIG. 8 is a flowchart for showing processing by the display device control section 2 for setting the target brightness LON. Note here that these characteristics shown in FIG. 7 are stored in a memory in the display control section 2.

First, the display control section 2 sets a target brightness LON based on an instruction sent from, for example, an external device (step S1). Next, the display control section 2 determines a current value ION that corresponds to the target brightness LON based on the current vs. brightness characteristic of the organic EL element 20 shown in FIG. 7A (step S2). Next, the display control section 2 determines voltage values of VSON and VELON corresponding to the ION value based on the voltage vs. current characteristics of both the organic EL element 20 and the SCR 30 shown in FIG. 7B (step S3). The display control section 2 then sums up the VSON and VELON values to determine a common voltage VA (step S4) and outputs a signal for setting at the VA value to the common power source (step S5). By these operations, the value of VA determined at step S4 is supplied from the common power source to the organic EL element 1. It is thus possible to adjust the element characteristics so that a desired target brightness LON can be obtained.

As described above, this embodiment has such a configuration that an SCR is used as an element for driving an organic EL element to thereby control the break-over voltage of the SCR for optimal driving, thus enabling realizing active driving of a high-performance organic EL display excellent in numeric aperture, contrast, etc. with a relatively simple construction.

Furthermore, as compared to the case of using a TFT as the driving element, an extremely easy manufacturing process can be used, that is, an SCR can be stacked on a stack-type organic EL element using the same technology including evaporation as that for manufacture of the organic EL element, thus reducing the manufacturing costs.

Figure 9A:
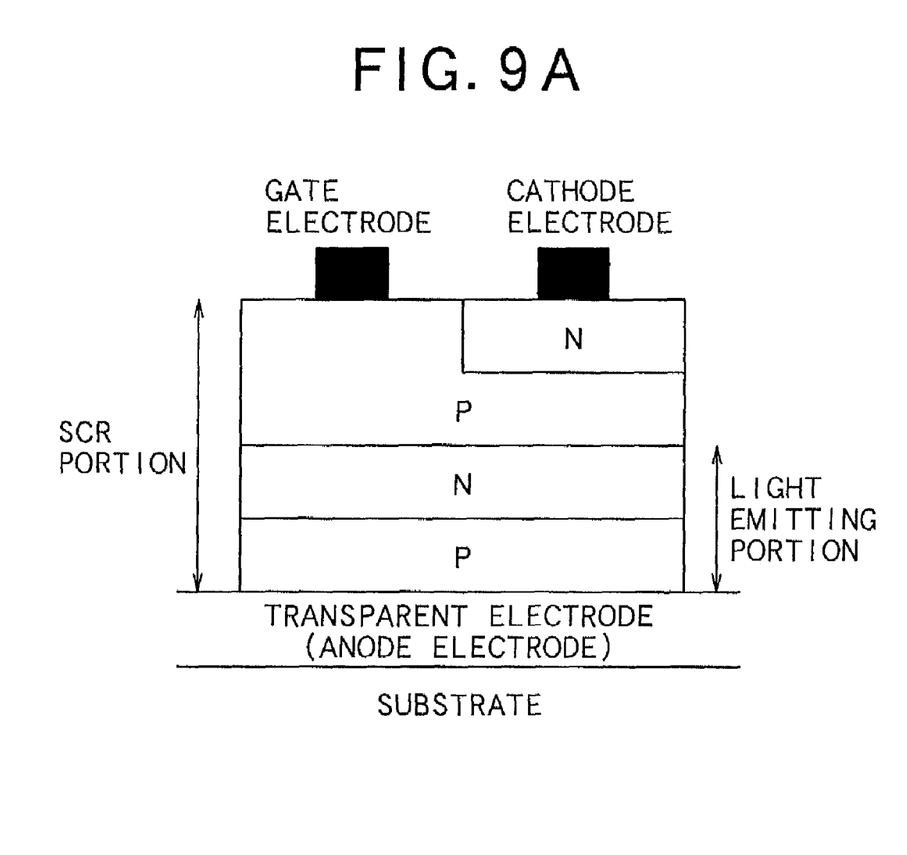
FIGS. 9A and 9B are illustrations for showing an example of an element construction according to another embodiment in which a light emitting SCR is provided.
Figure 9B:
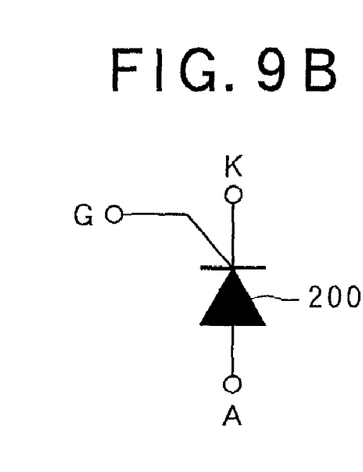

Now, see FIGS. 9 showing an example of an element construction according to another embodiment. The example of FIG. 9A has a light emitting SCR 200 construction that integrates therein the organic element 20 and the SCR 30, which are separated in FIG. 2A. FIG. 9B indicates an equivalent circuit of the element construction of the FIG. 9A. The light emitting SCR element-array, connections, and driving method shown in FIGS. 9 are the same as those of the organic EL element 20 plus SCR 30 construction shown in FIG. 2. In this embodiment, a self emission display can be manufactured by even simpler construction than the organic EL element 20 plus SCR 30 construction.

Figure 10A:
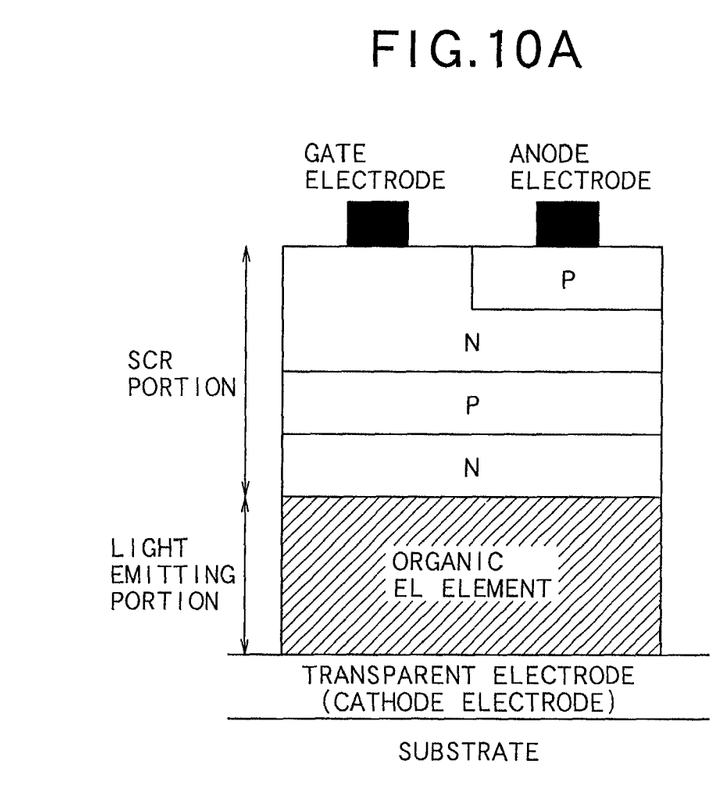
FIGS. 10A to 10C are illustrations for showing an example of the element construction according to the embodiment in which an N-gate type SCR is applied.
Figure 10B:
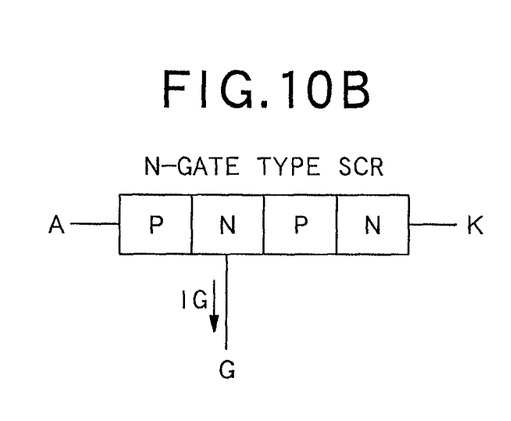
Figure 10C:
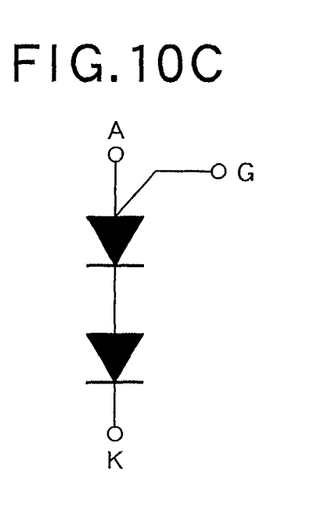

Although the above-mentioned embodiments have used a P-gate type SCR as the driving element, an N-gate type SCR such as shown in FIG. 10 may be applied (in this case, the anode A and the cathode K are reversed in function), to obtain the same effects as those by the above embodiments.

Further, an N-gate type light emitting SCR may be used to obtain the same effects.

Although the above-mentioned embodiments have used a transparent electrode as the substrate side electrode to thereby emit light from the side of the substrate, the electrode opposite the substrate may be used as the transparent electrode to thereby emit light to the side opposite to the substrate, thus obtaining the same effects.

Furthermore, although the above-mentioned embodiments have exemplified an organic EL element as the light emitting element in description, the present invention is not limited thereto; for example, any other self emission element may be used such as a light emitting diode (LED).

The invention may be embodied on other specific forms without departing from the spirit or essential characteristics thereof. The present embodiments therefore to be considered in all respects as illustrative and not restrictive, the scope of the invention being indicated by the appended claims rather than by the foregoing description and all changes which come within the meaning an range of equivalency of the claims are therefore intended to embraced therein.

The entire disclosure of Japanese Patent Application No. 2001-80264 filed on Mar. 21, 2001 including the specification, claims, drawings and summary is incorporated herein by reference in its entirety.

The invention claimed is:

1. A self emission display device for controlling a lit-up/non-lit-up state of a light emitting element by controlling a current flowing therethrough comprising:
   a plurality of light emitting elements arrayed in a matrix and connected to electrodes; and
   a plurality of SCRs for controlling a current flowing through the light emitting elements, corresponding to each of the light emitting elements;
   wherein each of the light emitting elements is connected to an anode in each of the SCRs,
   wherein said each of the SCRs is provided so as to correspond to each of said light emitting elements connected to electrodes.

2. A self emission display device for controlling a lit-up/non-lit-up state of a light emitting element by controlling a current flowing therethrough comprising:
   a plurality of light emitting elements arrayed in a matrix and connected to electrodes; and
   a plurality of SCRs for controlling a current flowing through the light emitting elements, corresponding to each of the light emitting elements;
   wherein each of the light emitting elements is connected to a cathode in each of the SCRs,
   wherein said each of the SCRs is provided so as to correspond to each of said light emitting elements connected to electrodes.

3. The self emission display device according to claim 1 or 2, wherein the light emitting elements are organic EL elements.

4. The self emission display device according to claim 1 or 2, wherein the light emitting elements are light emitting diodes.

5. The self emission display device according to claim 1 or 2, wherein a ratio in static capacity between the SCR and the light emitting element is adjusted to thereby optimize a ratio of a voltage applied to the SCR and a voltage applied to the light emitting element in a non-conducting state.

6. The self emission display device according to claim 1 or 2, wherein the self emission display device has a control function to set a current value that corresponds to a target brightness based on a current vs. brightness characteristic of the light emitting element to thereby set an optimal source voltage that corresponds to the set current value based on voltage vs. current characteristics of both the SCR and the light emitting element.

7. The self emission display device according to claim 1 or 2, wherein the lit-up/non-lit-up states of each of the light emitting elements are determined by a voltage value applied to a gate in each of the SCRs.

8. The self emission display device according to claim 1 or 2, wherein a break-over voltage in each of the SCRs is determined by a voltage value applied to a gate in each of the SCRs, the light emitting element is lighted up by decreasing the break-over voltage.

9. A method for driving a self emission display device having a plurality of light emitting elements arrayed in a matrix and a plurality of SCRs for controlling a current flowing through the light emitting elements, wherein each of the light emitting elements is connected to an anode in each of the SCRs, comprising:
- a process of providing a plurality of light emitting elements, each of said light emitting elements connected to an anode of a respective SCR and each of said light emitting elements connected to electrodes;
- a process of scanning sequentially each of the SCRs; and
- a process of driving each of the SCRs so that each of the light emitting elements be sustained in a conducting or non-conducting state,
- wherein each said respective SCR is provided so as to correspond to each of said light emitting elements connected to electrodes.

10. A method for driving a self emission display device having a plurality of light emitting elements arrayed in a matrix and a plurality of SCRs for controlling a current flowing through the light emitting elements, wherein each of the light emitting elements is connected to a cathode in each of the SCRs, comprising:
- a process of providing a plurality of light emitting elements, each of said light emitting elements connected to an anode of a respective SCR and each of said light emitting elements connected to electrodes;
- a process of scanning sequentially each of the SCRs; and
- a process of driving each of the SCRs so that each of the light emitting elements be sustained in a conducting or non-conducting states,
- wherein each said respective SCR is provided so as to correspond to each of said light emitting elements connected to electrodes.

11. A method for driving a self emission display device having a plurality of light emitting elements arrayed in a matrix and a plurality of SCRs for controlling a current flowing through the light emitting elements, comprising:
- a process of providing a plurality of light emitting elements, each of said light emitting elements connected to an anode of a respective SCR and each of said light emitting elements connected to electrodes;
- a process of scanning sequentially each of the SCRs to provide each of the light emitting elements with a selected period in which a lit-up/non-lit-up state of the light emitting elements is determined; and
- a process of applying a predetermined voltage to a gate of the corresponding one of the SCRs in the selected period to light up any of the light emitting elements,
- wherein each said respective SCR is provided so as to correspond to each of said light emitting elements connected to electrodes.

12. The method for driving a self emission display device according to claim 9 or 10, wherein the light emitting elements are organic EL elements.

13. The method for driving a self emission display device according to claim 9 or 10, wherein the light emitting elements are light emitting diodes.

14. The method for driving a self emission display device according to claim 9 or 10, wherein a ratio in static capacity between the SCR and the light emitting element is adjusted to thereby optimize a ratio of a voltage applied to the SCR and a voltage applied to the light emitting element in a non-conducting state.

15. The method for driving a self emission display device according to claim 9 or 10, wherein the method comprises:
- a process of setting a current value that corresponds to a target brightness based on a current vs. brightness characteristic of the light emitting element; and
- a process of setting an optimal source voltage that corresponds to the set current value based on voltage vs. current characteristics of both the SCR and the light emitting element.

16. The method for driving a self emission display device according to claim 9 or 10, wherein:
- each of the SCRs are of a P-gate type, each of the gates of which are connected to a common gate switch that can switch over a high potential and a low potential for each column in a matrix, each of the anodes of which are connected via their respective ones of the light emitting elements to a common power source, and each of the cathodes of which are connected for each row thereof in the matrix to a common scan switch that can switch over a high potential, a low potential, and an intermediate potential;
- when each of the light emitting elements is in a non-selected period, the gate switches is set to the high potential and the scan switches is set to the intermediate potential; and
- when each of the light emitting elements is in a selected period, the scan switches is set to the high potential and then to the low potential and, to light up any one of the light emitting element, the gate switches is set to the high potential in a period when the scan switch is at the low potential and also, not to light up the light emitting element, the gate switches is set to the lower potential in a period when the scan switch is at the low potential, to thereby sustain a conducting/non-conducting state of each of the light emitting elements in driving.

17. The method for driving a self emission display device according to claim 9 or 10, wherein:
- each of the SCRs are of an N-gate type, each of the gates of which are connected to a common gate switch that can switch over a high potential and a low potential for each column in a matrix, each of the cathodes of which are connected via their respective ones of the light emitting elements to a common power source, and each of the anodes of which are connected for each row thereof in the matrix to a common scan switch that can switch over a high potential, a low potential, and an intermediate potential;
- when each of the light emitting elements is in non-selected period, the gate switches is set to the high potential and the scan switches is set to the intermediate potential; and
- when each of the light emitting elements is in a selected period, the scan switches is set to the high potential and then to the low potential and, to light up any one of the light emitting element, the gate switches is set to the low potential in a period when the scan switch is at the high potential and also, not to light up the light emitting element, the gate switches is set to the high potential in a period when the scan switch is at the high potential, to thereby sustain a conducting/non-conducting state of each of the light emitting elements in driving.

* * * * *